United States Patent [19]
Huang et al.

[11] Patent Number: 5,535,146
[45] Date of Patent: Jul. 9, 1996

[54] METHOD FOR PRODUCING A SEMICONDUCTOR DEVICE USING LOGIC SIMULATION APPROACH AND SIMULATE A MULTI-PEAK RESONANT TUNNELING DIODE-BASED ELECTRONIC CIRCUIT AND A LARGE SIGNAL MULTI-PEAK RESONANT TUNNELING DIODE SPICE MODEL EMPLOYED IN THE LOGIC SIMULATION APP

[75] Inventors: Chih-Yuan Huang, Kaohsiung; Yan-Kuin Su, Tainan, both of Taiwan; James E. Morris, Binghamton, N.Y.

[73] Assignee: National Science Council of R.O.C., Taipei, Taiwan

[21] Appl. No.: 429,573

[22] Filed: Apr. 27, 1995

[51] Int. Cl.$^6$ .............................. G06F 17/50; G06G 7/48
[52] U.S. Cl. ....................................... 364/578; 364/488
[58] Field of Search ......................... 364/578, 488, 364/489, 490, 468; 395/500; 357/57, 61, 4; 371/22.3; 257/17, 25, 15

[56] References Cited

U.S. PATENT DOCUMENTS

| | | | |
|---|---|---|---|
| 4,620,206 | 10/1986 | Ohta et al. | 354/7 |
| 4,831,340 | 5/1989 | Sollner | 331/76 |
| 4,939,681 | 7/1990 | Yokomizo et al. | 364/578 |
| 4,985,860 | 1/1991 | Vlach | 364/578 |
| 5,017,973 | 5/1991 | Mizuta et al. | 357/4 |
| 5,105,373 | 4/1992 | Rumsey et al. | 364/578 |
| 5,297,066 | 3/1994 | Mayes | 364/578 |
| 5,313,398 | 5/1994 | Rohrer et al. | 364/468 |
| 5,345,401 | 9/1994 | Tani | 364/578 |
| 5,379,231 | 1/1995 | Pillage et al. | 364/488 |
| 5,381,345 | 1/1995 | Takegami et al. | 364/491 |
| 5,394,346 | 2/1995 | Milsom | 364/578 |

OTHER PUBLICATIONS

Yan et al., "New RTD Large–Signal DC Model Suitable for PSPICE," IEEE Transaction on CAD of Integrated Circuits and Systems, Feb. 1995, pp. 167–172.

Huang et al., "An Improved Multipeak Resonant Tunneling Diode Model for Nine State Resonant Tunneling Diode Memory Circuit Simulation," IEEE, 1995, pp. 1705–1707.

Michael et al., "Differential Multiple–Valued Logic Using Resonant Tunneling Diodes," IEEE, pp. 189–195.

Kuo et al., "Large Signal Resonant Tunneling Diode Model for SPICE3 Simulation," IEEE, 1989, pp. 21.7.1–21.7.4.

Kuo et al., "A Novel A/D Converter Using Resonant Tunneling Diodes," IEEE, 1991, pp. 145–149.

Mohan et al., "Circuit Simulation of Resonant Tunneling Devices Using NDR–SPICE," IEEE 1994, pp. 229–232.

T. H. Kuo and H. C. Lin "Large–Signal Resonant Tunneling Diode for SPICE3 Simulation": IEDM TECH. Dig., 1989, pp. 567–569.

Z. X. Yan and M. J. Deen "A new resonant–Tunnel Diode––Based multi–valued Circuit using a MESFET Depletion Load" IEEE J. Solid–State Circuits, 1992, SC–27, (8) pp. 1198–1202.

*Primary Examiner*—Vincent N. Trans
*Assistant Examiner*—Thai Phan
*Attorney, Agent, or Firm*—Cushman Darby & Cushman

[57] ABSTRACT

In a method for producing a semiconductor device using a logic simulation approach, a circuit model for a user-specified design of a multi-peak resonant tunneling diode-based electronic circuit is provided and includes a plurality of circuit devices. One of the circuit devices is a multi-peak resonant tunneling diode which is modeled by a parasitic resistance in series with parallel combination of a voltage-controlled current source and an intrinsic capacitance. The voltage-controlled current source has an equivalent circuit model with a function stage for realizing current-voltage characteristic curve of the resonant tunneling diode. The function stage includes parallel combination of at least one first circuit branch, at least one second circuit branch and a third circuit branch. Each of the first and second circuit branches has a resistor, a diode and a voltage source. The third circuit branch has a resistor and a voltage source. The first and third circuit branches represent positive resistance sections, and the second and third circuit branches represent negative resistance sections of the current-voltage characteristic curve.

26 Claims, 7 Drawing Sheets

| | $V_{1A}$ | $V_{2B}$ | $V_{1C}$ | $V_{1D}$ | $V_{2E}$ | $V_{1F}$ | $V_{1G}$ | $V_3$ |
|---|---|---|---|---|---|---|---|---|
| VOLTAGE (V) | 0.2 | 0.59 | 0.6 | 0.68 | 1.19 | 1.2 | 1.45 | 0.92 |
| | $R_{1A}$ | $R_{2B}$ | $R_{1C}$ | $R_{1D}$ | $R_{2E}$ | $R_{1F}$ | $R_{1G}$ | $R_3$ |
| RESISTOR (Ω) | 831.557 | 11.890 | 11.962 | 3782.05 | 10.014 | 10.044 | 1973.68 | -5.46 |

FIG.5

METHOD FOR PRODUCING A SEMICONDUCTOR DEVICE USING LOGIC SIMULATION APPROACH AND SIMULATE A MULTI-PEAK RESONANT TUNNELING DIODE-BASED ELECTRONIC CIRCUIT AND A LARGE SIGNAL MULTI-PEAK RESONANT TUNNELING DIODE SPICE MODEL EMPLOYED IN THE LOGIC SIMULATION APP

BACKGROUND OF THE INVENTION

1. Field of the Invention

The invention relates to the design and manufacture of an electronic circuit, and more particularly to a method for producing a semiconductor device using a logic simulation approach to simulate a multi-peak resonant tunneling diode (RTD)-based electronic circuit and a large signal multi-peak RTD SPICE model employed in the logic simulation approach.

2. Description of the Related Art

Currently, research in the use of resonant tunneling diodes (RTD) in electronic circuits, such as frequency multipliers, analog-to-digital converters and multi-valued memories (MVM), is becoming more intense. Circuit simulators are usually employed in the design and manufacture of RTD-based electronic circuits in view of the great expense that would be incurred if an actual physical prototype of the electronic circuit is needed before one can determine if the electronic circuit would operate in the intended manner. SPICE is an example of a circuit simulation program used to predict the operation of a circuit design. SPICE simulates a circuit model by employing equations which attempt to define mathematically the operation of the various circuit components in the circuit design, and provides output signal information as a result of the simulation.

Presently, there are two available RTD models for SPICE. The first is an RTD switch model described in a publication by T. H. Kuo and H. C. Lin entitled "Large-signal Resonant Tunneling Diode for SPICE3 Simulation," IEDM Tech. Dig., 1989, pp. 567–570. The second is described in a publication by Z. X. Yan and M. J. Deen entitled "A New Resonant-Tunnel Diode-Based Multi-valued Circuit Using a MESFET Depletion Load," IEEE J. Solid-State Circuits, 1992, SC-27, (8), pp. 1198–1202.

The RTD switch model described in the first publication has a relatively complicated construction that becomes more and more complex as the number of peaks in the current-voltage characteristic curve of the RTD increases. This makes it inconvenient to provide circuit information to a computer loaded with the SPICE3 circuit simulation program, and may result in convergence problems during simulation.

In the second publication, a single-peak RTD is modeled by a parasitic resistance in series with the parallel combination of a voltage-controlled current source and an intrinsic capacitance. The voltage-controlled current source is implemented in SPICE using the look-up table's statement, which contains RTD measured characterizing data. A multi-peak RTD, however, is modeled as a series combination of at least two single-peak RTDs, thereby resulting in a complicated model that makes it difficult to input circuit information to a computer loaded with the SPICE program. Furthermore, convergence problems may also occur during simulation due to the complexity of the multi-peak RTD model that is in use. In addition, the look-up table's statement, which is a built-in feature of SPICE, does not accurately define the operation of a multi-peak RTD.

SUMMARY OF THE INVENTION

Therefore, the object of the present invention is to provide a method for producing a semiconductor device using a logic simulation approach to simulate a multi-peak resonant tunneling diode (RTD)-based electronic circuit, a large signal multi-peak RTD SPICE model employed in the logic simulation approach having a less complicated construction that can obviate convergence problems during simulation, that can ensure accurate simulation of the operation of the electronic circuit, and that can facilitate providing of circuit information to a computer loaded with the SPICE computer simulation program.

According to one aspect of the present invention, a method for producing a semiconductor device using a logic simulation approach comprises the steps of:

(a) providing a circuit model for a user-specified design of a multi-peak resonant tunneling diode-based electronic circuit which includes a plurality of circuit devices, one of the circuit devices being a multi-peak resonant tunneling diode which is modeled by a parasitic resistance in series with parallel combination of a voltage-controlled current source and an intrinsic capacitance, the voltage-controlled current source having an equivalent circuit model with a function stage for realizing current-voltage characteristic curve of the multi-peak resonant tunneling diode, the function stage including:

at least one first circuit branch having a resistor, a diode with an anode connected electrically to the resistor, and a voltage source with a positive terminal connected to a cathode of the diode;

at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch;

the first and third circuit branches representing positive resistance sections, and the second and third circuit branches representing negative resistance sections of the current-voltage characteristic curve;

(b) providing design data, which specifies each of the circuit devices and connections of the circuit devices in the circuit model, to a computer loaded with a circuit simulation program in a format acceptable to the circuit simulation program;

(c) running the computer to simulate operation of the electronic circuit; and (d) effecting a patterning of the electronic circuit on a semiconductor wafer to produce the semiconductor device after verifying, based on results of the simulation, that the electronic circuit will operate as intended.

According to another aspect of the present invention, a method for simulating operation of a user-specified design of a multi-peak resonant tunneling diode-based electronic circuit comprises the steps of:

(a) providing a circuit model for the electronic circuit which includes a plurality of circuit devices, one of the circuit devices being a multi-peak resonant tunneling diode which is modeled by a parasitic resistance in series with parallel combination of a voltage-controlled current source and an intrinsic capacitance, the voltage-controlled current source having an equivalent circuit model with a function stage for realizing current-voltage characteristic curve of the multi-peak resonant tunneling diode, the function stage including:

at least one first circuit branch having a resistor, a diode with an anode connected electrically to the resistor, and a voltage source with a positive terminal connected to a cathode of the diode;

at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch;

the first and third circuit branches representing positive resistance sections, and the second and third circuit branches representing negative resistance sections of the current-voltage characteristic curve;

(b) providing design data, which specifies each of the circuit devices and connections of the circuit devices in the circuit model, to a computer loaded with a circuit simulation program in a format acceptable to the circuit simulation program; and (c) running the computer to simulate operation of the electronic circuit.

According to a further aspect of the present invention, a large signal multi-peak resonant tunneling diode SPICE model comprises a parasitic resistance in series with parallel combination of a voltage-controlled current source and an intrinsic capacitance. The voltage-controlled current source has an equivalent circuit model with a function stage for realizing current-voltage characteristic curve of the multi-peak resonant tunneling diode. The function stage includes: at least one first circuit branch having a resistor, a diode with an anode connected electrically to the resistor, and a voltage source with a positive terminal connected to a cathode of the diode; at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch. The first and third circuit branches represent positive resistance sections, and the second and third circuit branches represent negative resistance sections of the current-voltage characteristic curve.

The function stage further includes an input voltage source representing sweeping DC voltage range of the current-voltage characteristic curve, and a dummy voltage source which interconnects the input voltage source to the first, second and third circuit branches and which serves to measure output current flowing through the multi-peak resonant tunneling diode.

The circuit model further includes an input stage for implementing input resistance of the multi-peak resonant tunneling diode, and an output stage for implementing output resistance of the multi-peak resonant tunneling diode.

The current-voltage characteristic curve has starting and ending points and multiple break-points between the starting and ending points that are interconnected to form a series of linear segments which approximate the current-voltage characteristic curve. Each of the first circuit branches is associated with a corresponding one of the breakpoints that is connected to adjacent upward linear segments. Each of the second circuit branches is associated with a corresponding one of the breakpoints that is connected to adjacent downward linear segments.

The resistor in each of the first and second circuit branches is equal to the absolute value of the reciprocal of the difference in the slopes of the adjacent linear segments connected to the corresponding breakpoint, and the voltage source in each of the first and second circuit branches is equal to the breakpoint voltage.

BRIEF DESCRIPTION OF THE DRAWINGS

Other features and advantages of the present invention will become apparent in the following detailed description of the preferred embodiment, with reference to the accompanying drawings, of which:

FIG. 5 is a table which illustrates the element values of a function stage of the voltage controlled current source of the multi-peak RTD SPICE model shown in FIG. 4;

DETAILED DESCRIPTION OF THE PREFERRED EMBODIMENT

In the production of a semiconductor device in accordance with the present invention, simulation of a user-specified design of a multi-peak resonant tunneling diode (RTD)-based electronic circuit is performed, prior-to effecting patterning of the electronic circuit on a semiconductor wafer to produce the semiconductor device, in order to verify, based on the results of the simulation, that the electronic circuit will operate as intended.

In accordance with this invention, the logic simulation approach is performed as follows: providing a circuit model for the electronic circuit which includes a plurality of circuit devices, one of the circuit devices being a multi-peak RTD; providing design data, which specifies each of the circuit devices and connections of the circuit devices in the circuit model, to a computer loaded with a SPICE circuit simulation program in a format acceptable to the latter; and running the computer to simulate operation of the electronic circuit.

Figure 1:
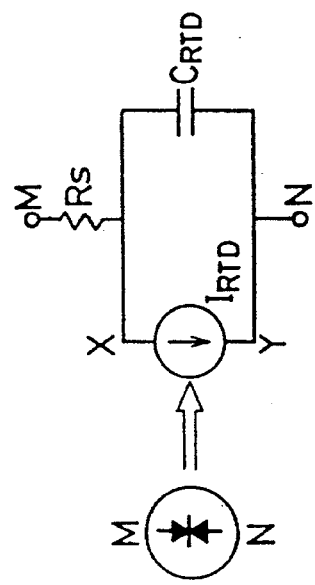
FIG. 1 illustrates a large-signal multi-peak RTD SPICE model according to the present invention.

Referring to FIG. 1, the large-signal multi-peak RTD SPICE model of the present invention is based on the single-peak RTD SPICE model described in the publication by Z. X. Yan and M. J. Deen that was mentioned beforehand. As shown, a multi-peak RTD is modeled by a parasitic resistance $R_S$ (including the series contact and bulk resistance) in series with the parallel combination of a voltage-controlled current source $I_{RTD}$ and an intrinsic capacitance $C_{RTD}$. However, unlike the aforementioned single-peak RTD SPICE model, the voltage-controlled current source $I_{RTD}$ is not implemented by using the look-up table's statement in SPICE. Instead, an equivalent circuit model is employed, as shown in FIG. 2.

Figure 2:
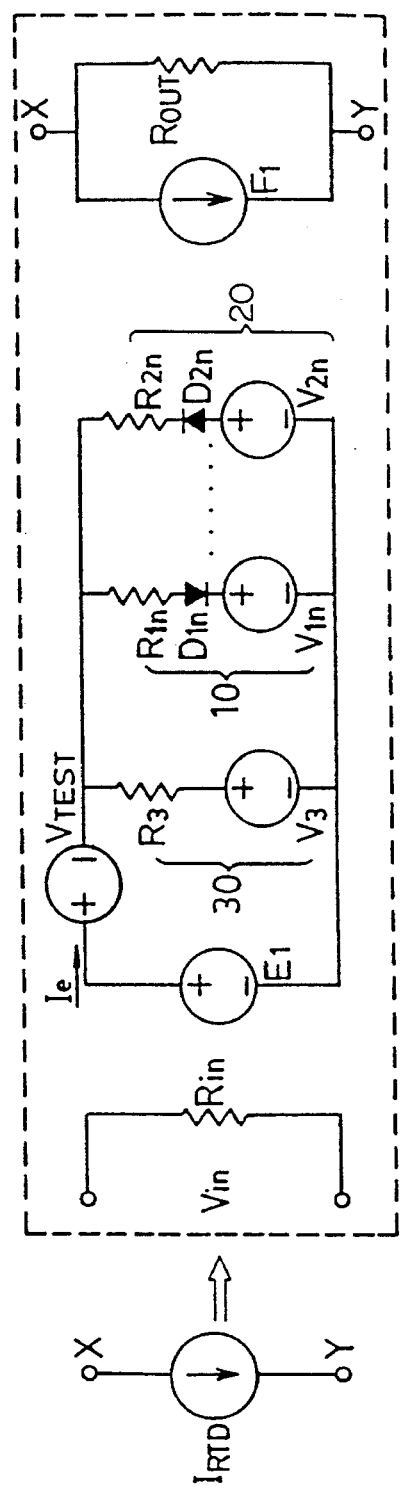
FIG. 2 illustrates an equivalent circuit model for the voltage-controlled current source shown in FIG. 1.

Referring to FIG. 2, the equivalent circuit model for the voltage-controlled current source $I_{RTD}$ is shown to comprise an input stage for implementing the RTD input resistance, a function stage for realizing the multi-peak RTD current-voltage (I–V) characteristic curve, and an optional output stage for duplicating the output resistance.

The input voltage $V_{in}$ at the input stage represents the sweeping DC voltage of the multi-peak RTD I–V characteristic curve. The resistor $R_{in}$ in the input stage represents the input resistance of the multi-peak RTD and is designated as 1 MΩ for SPICE simulation.

The function stage comprises the parallel combination of at least one first circuit branch 10, at least one second circuit branch 20, and a third circuit branch 30.

Each first circuit branch 10 includes a resistor $R_{1n}$, a diode $D_{1n}$ having an anode connected electrically to the resistor $R_{1n}$, and a voltage source $V_{1n}$ having a positive terminal connected to a cathode of the diode $D_{1n}$.

Each second circuit branch 20 is connected in parallel to the first circuit branch 10 and includes a resistor $R_{2n}$, a diode $D_{2n}$ having a cathode connected electrically to the resistor $R_{2n}$, and a voltage source $V_{2n}$ having a positive terminal connected to an anode of the diode $D_{2n}$.

The third circuit branch 30 is connected in parallel to the first and second circuit branches 10, 20 and includes a resistor $R_3$ and a voltage source $V_3$ having a positive terminal connected to the resistor $R_3$.

The first and third circuit branches 10, 30 represent positive resistance sections of the I–V characteristic curve of the multi-peak RTD that is to be modeled, while the second and third circuit branches 20, 30 represent negative resistance sections of the same.

The function stage further comprises a voltage source $E_1$ which, at unity gain, is identical to the input voltage $V_{in}$ at the input stage. A dummy voltage source $V_{test}$ interconnects the voltage source $E_1$ to the first, second and third circuit branches 10, 20, 30 and measures the output current $I_e$ flowing through the multi-peak RTD.

The resistor $R_{out}$ in the output stage represents the output resistance of the multi-peak RTD and is designated as 1 MΩ for SPICE simulation. The output stage has a linear dependent current source $F_1$ which is connected across the resistor $R_{out}$. The current source $F_1$ has unity gain and reflects the current $I_e$ through the dummy voltage source $V_{test}$ to the output stage.

The output stage serves as a practical RTD output voltage source. If only the corresponding output current $I_e$ is required during circuit simulation, the equivalent circuit model can be further simplified by removing the output stage.

The number of first and second circuit branches 10, 20, the resistances of the resistors $R_{1n}$, $R_{2n}$, and the voltages generated by the voltage sources $V_{1n}$, $V_{2n}$ are determined based on the I–V characteristic curve of the multi-peak RTD that is to be modeled.

Figure 3:
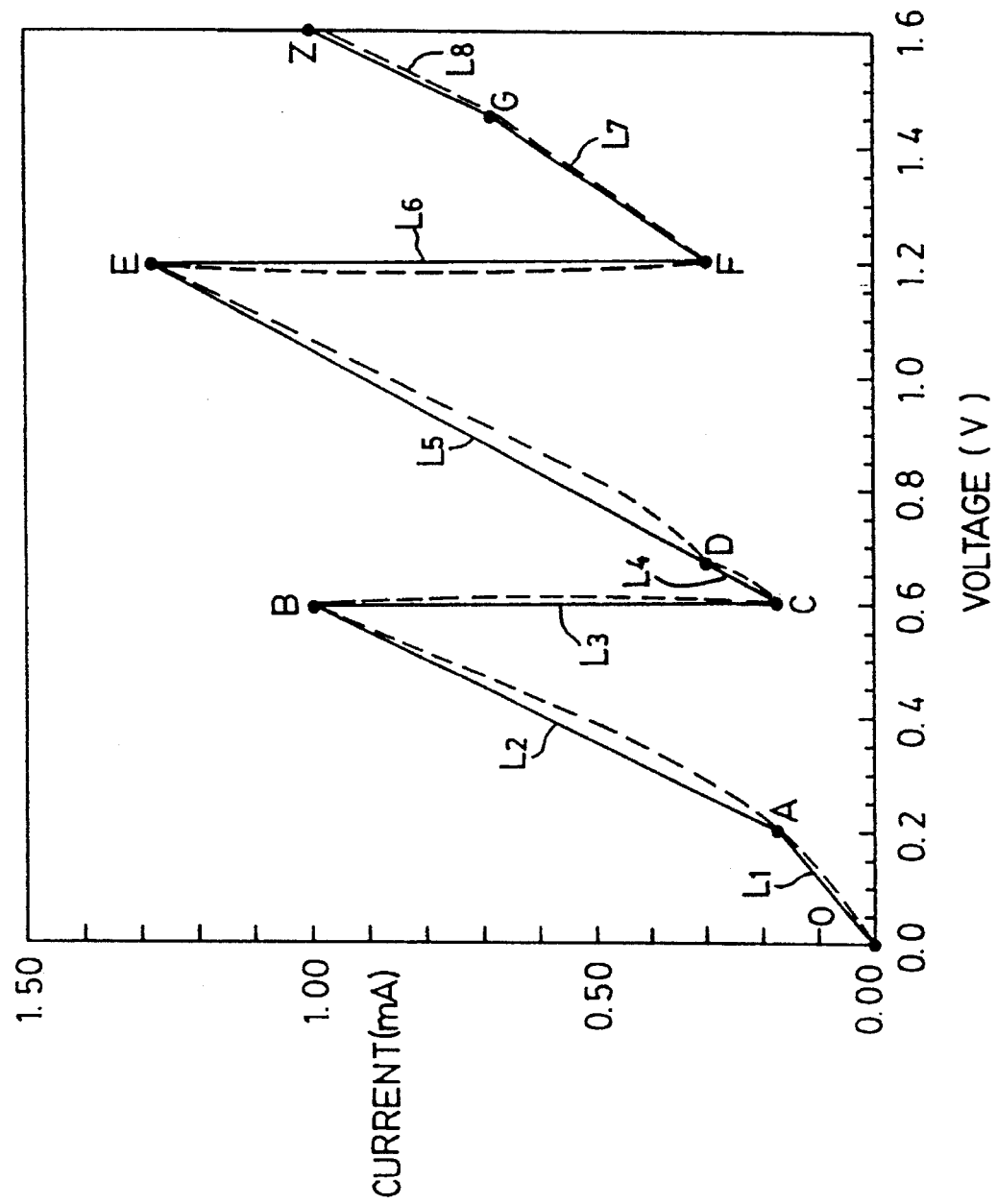
FIG. 3 illustrates the current-voltage (I–V) characteristic curve of a multi-peak RTD to be employed in an electronic circuit in accordance with this invention.

FIG. 3 illustrates the I–V characteristic curve (shown in dotted lines) of a multi-peak RTD in an electronic circuit in accordance with this invention. Piecewise linear (PWL) approximation is employed to approximate the non-linear characteristic curve as a series of linear sections by selecting multiple breakpoints of the characteristic curve. In this embodiment, the multi-peak RTD is a two-peak RTD, and the starting and ending points of the I–V characteristic curve fall respectively at O (0 V, 0 mA) and Z (1.6 V, 1.0 mA). In addition, the following breakpoints between the starting and ending points are chosen: A (0.2 V, 0.18 mA), B (0.59 V, 1.0 mA), C (0.6 V, 0.18 mA), D (0.675 V, 0.3 mA), E (1.19 V, 1.28 mA), F (1.2 V, 0.3 mA) and G (1.45 V, 0.69 mA), thereby resulting in a line $L_1$ between points O and A, a line $L_2$ between points A and B, a line $L_3$ between points B and C, a line $L_4$ between points C and D, a line $L_5$ between points D and E, a line $L_6$ between points E and F, a line $L_7$ between points F and G, and a line $L_8$ between points G and Z. Therefore, each of the breakpoints A, B, C, D, E, F, G is associated with an anterior line and a posterior line. For example, the line $L_2$ serves as the anterior line and the line $L_3$ serves as the posterior line for the breakpoint B.

Each of the breakpoints A, B, C, D, E, F, G is associated with a corresponding one of the first and second circuit branches 10, 20. Whether the breakpoint A, B, C, D, E, F, G is associated with the first or second circuit branch 10, 20 depends on whether the anterior and posterior lines connected thereto are adjacent upward linear segments of the I–V characteristic curve or adjacent downward linear segments of the latter. In this embodiment, each of the breakpoints A, C, D, F, G is associated with a corresponding first circuit branch 10, while each of the breakpoints B, E is associated with a corresponding second circuit branch 20.

In each of the first and second circuit branches 10, 20, the resistor $R_{1n}$ is equal to the absolute value of the reciprocal of the difference in the slopes of the anterior and posterior lines connected to the corresponding breakpoint, while the voltage source $V_{1n}$, $V_{2n}$ is equal to the breakpoint voltage. The diodes $D_{1n}$, $D_{2n}$ serve as voltage controlled switches to formulate the PWL approximation.

Finally, the resistance of the resistor $R_3$ and the voltage generated by the voltage source $V_3$ of the third circuit branch 30 is determined by using Kirchhoff's voltage and current laws (KVL, KCL) at the starting and ending points of the characteristic curve.

Figure 4:
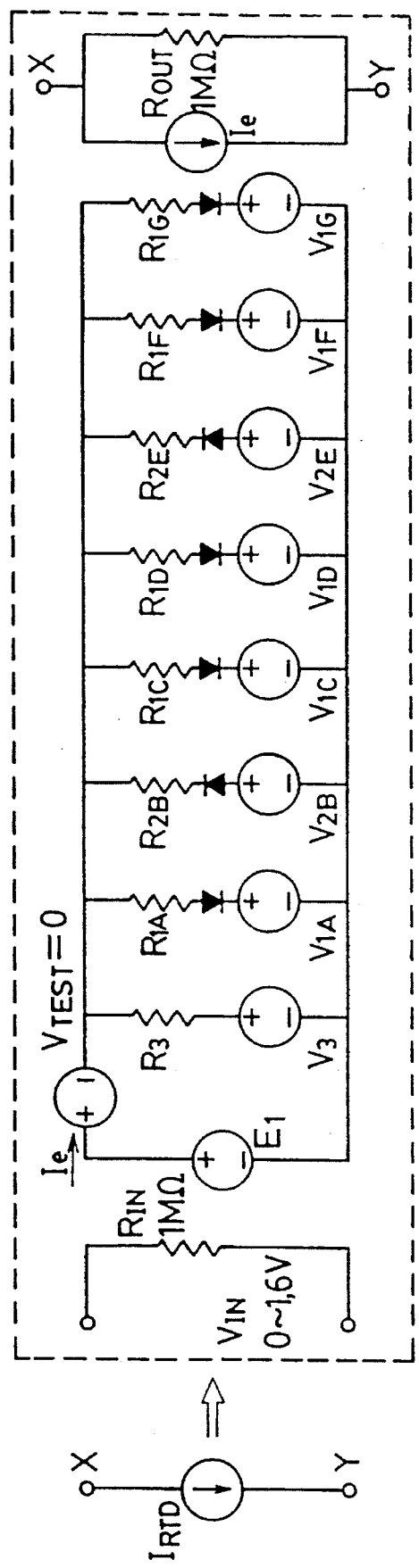
FIG. 4 is a schematic circuit diagram of a multi-peak RTD SPICE model of the present invention which complies with the I–V characteristic curve shown in FIG. 3.

FIG. 4 is a schematic circuit diagram of a multi-peak RTD SPICE model which complies with the I–V characteristic curve shown in FIG. 1. The element values of the first, second and third circuit branches 10, 20, 30, as obtained in the aforementioned manner, are shown in FIG. 5.

Figure 6:
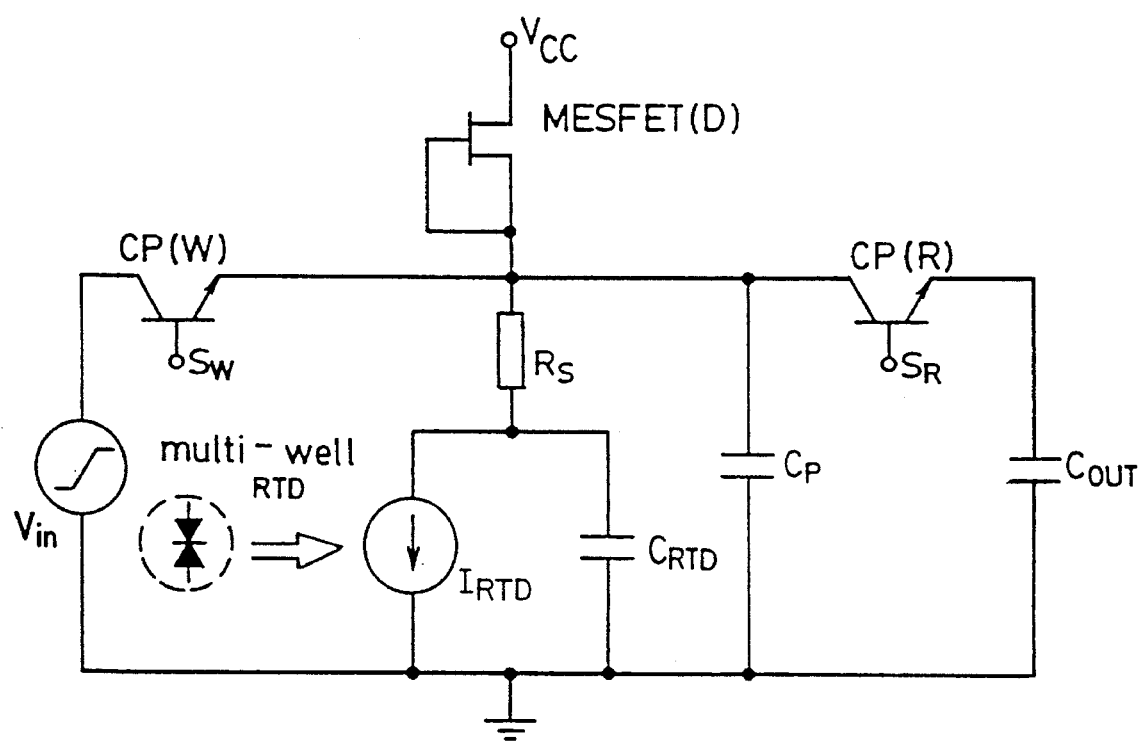
FIG. 6 is a schematic circuit diagram of an equivalent circuit model for an electronic circuit that is to be produced in accordance with the method of this invention.

FIG. 6 illustrates an equivalent circuit model for a three-state multi-peak RTD-based multi-valued memory (MVM) circuit that is to be produced in accordance with the present invention. As mentioned beforehand, prior to effecting patterning of the MVM circuit on a semiconductor wafer to produce the semiconductor device, simulation of the operation of the MVM circuit is performed, in order to verify, based on the results of the simulation, that the MVM circuit will operate as intended.

Figure 7:
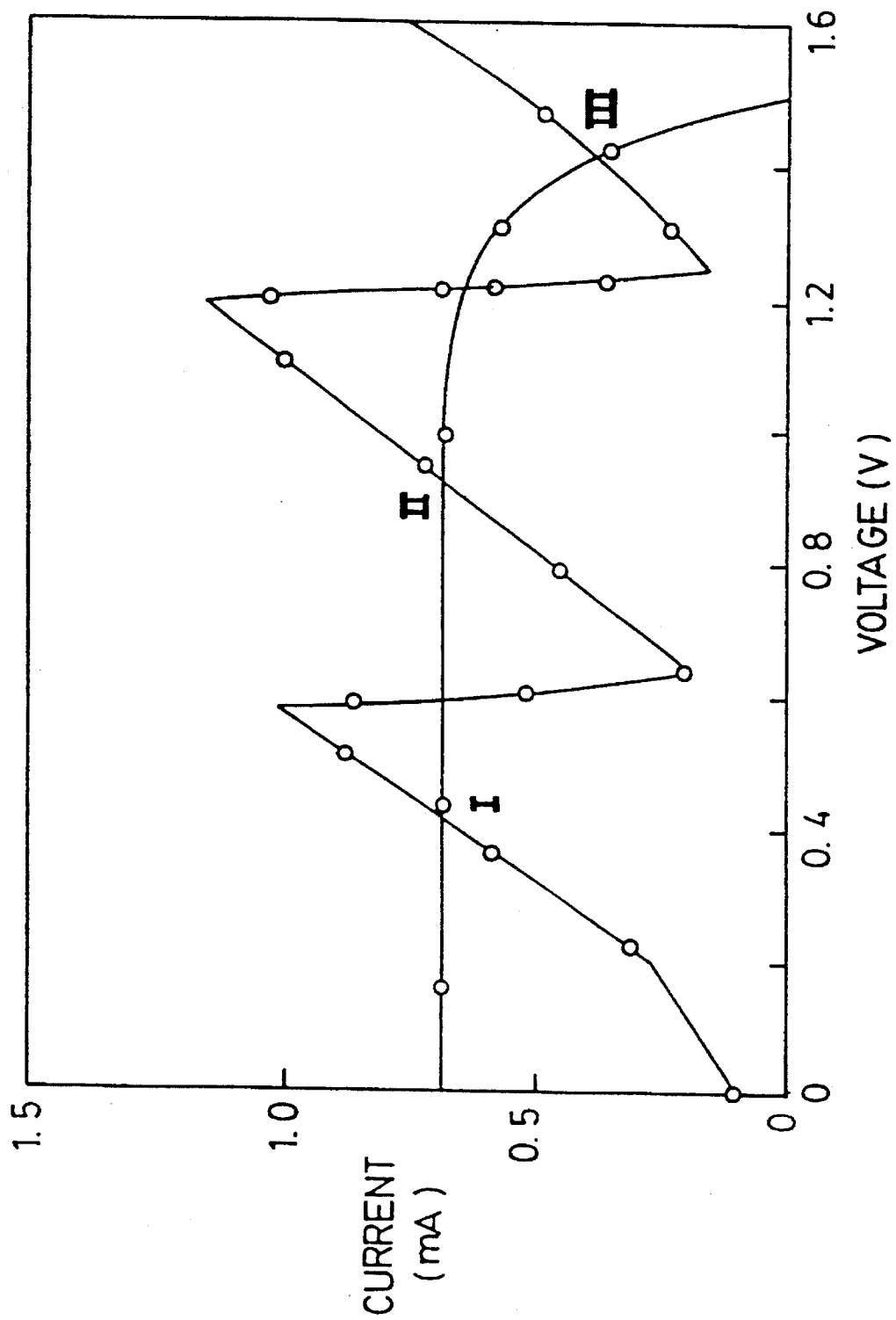
FIG. 7 illustrates the I–V characteristic curve of the multi-peak RTD in the equivalent circuit model shown in FIG. 6 and a MESFET load line which intersects the I–V characteristic curve.

The MVM circuit uses a depletion-load MESFET. As shown in FIG. 7, the load line for the MESFET intersects the positive resistance sections of the multi-peak RTD I–V characteristic curve at three operation points I, II, III which represent the three memory states of the MVM circuit.

Figure 8:
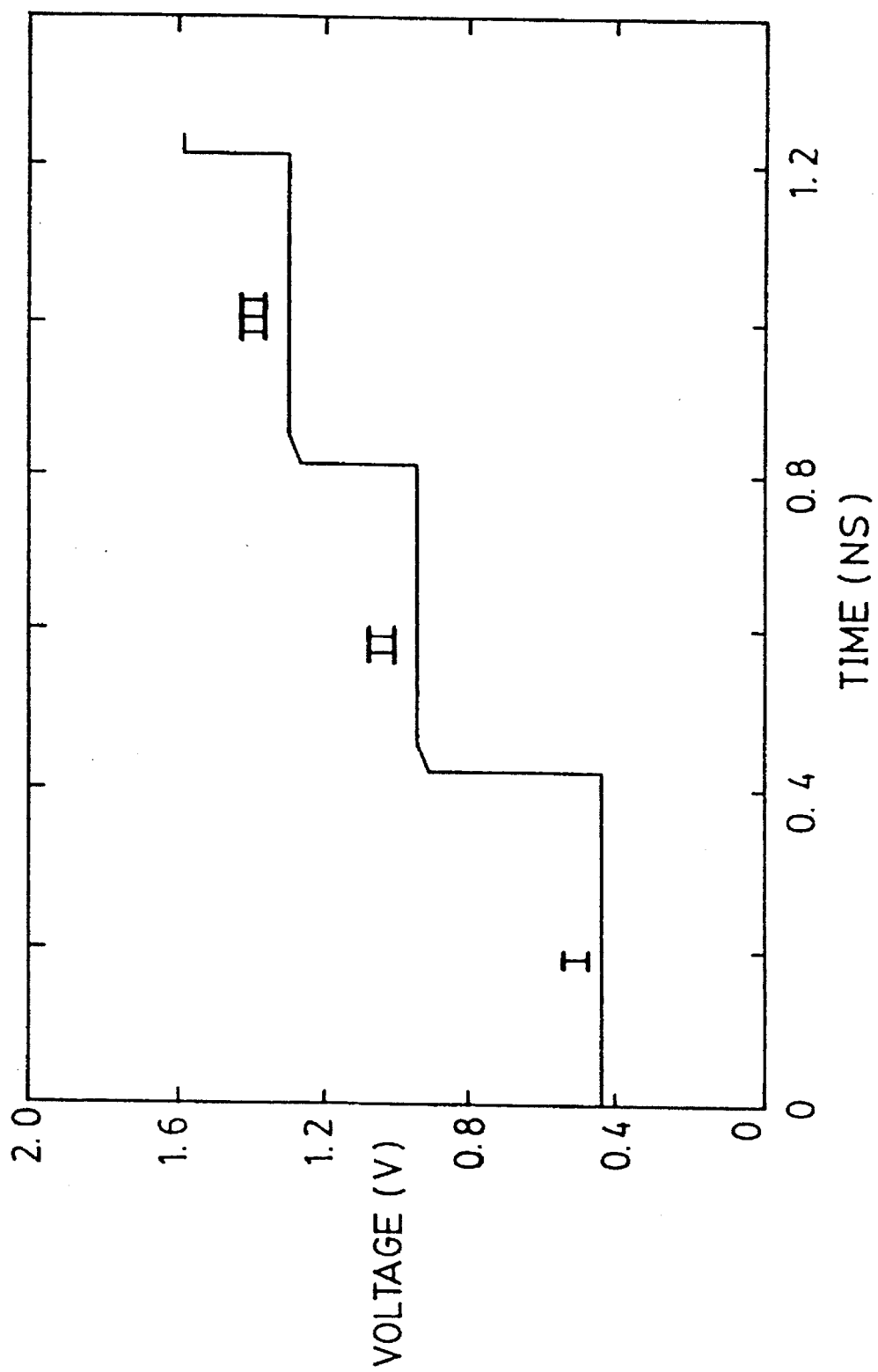
FIG. 8 shows the results of a simulation performed in accordance with this invention for the equivalent circuit model shown in FIG. 6.

To simulate the MVM circuit, design data, which specifies each of the circuit devices and connections of the circuit devices in the circuit model shown in FIG. 6, with the voltage-controlled current source $I_{RTD}$ being modeled as shown in FIG. 4, is provided to a computer loaded with a SPICE circuit simulation program. The computer is then run to simulate operation of the MVM circuit. FIG. 8 shows the simulated results of an output voltage across an output capacitor $C_{out}$ of the MVM circuit. The values of the voltages I, II, III in FIG. 8 match closely those in FIG. 7.

When the multi-peak RTD SPICE model of this invention is compared with the RTD switch model described in the publication by T. H. Kuo and H. C. Lin that was mentioned beforehand, it is observed that this invention requires 16 circuit elements for the simulation of a single-peak RTD I–V characteristic curve and 34 circuit elements for a four-peak RTD I–V characteristic curve, while the conventional RTD switch model requires 18 and 102 circuit elements to simulate single-peak and four-peak RTD I–V characteristic curves, respectively. As for the corresponding SPICE code, the RTD SPICE model of this invention requires 18 and 36 normal "job cards" as compared to 21 and 120 normal "job cards" for the conventional RTD switch model during single-peak and four-peak RTD simulations, respectively.

It has thus been shown that the large signal multi-peak RTD SPICE model of the present invention has a less complicated construction to obviate convergence problems during simulation. In addition, accurate simulation of the operation of the electronic circuit is ensured, and because of the SPICE model's simple construction, providing circuit information to a computer loaded with the SPICE computer simulation program can be facilitated. The objective of the present invention is thus attained.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A method for producing a semiconductor device using a logic simulation approach, comprising the steps of:

(a) providing a circuit model for a user-specified design of a multi-peak resonant tunneling diode-based electronic circuit which includes a plurality of circuit devices, one of the circuit devices being a multi-peak resonant tunneling diode which is modeled by a parasitic resistance in series with a parallel combination of a voltage-controlled current source and an intrinsic capacitance, the voltage-controlled current source having an equivalent circuit model with a function stage for realizing a current-voltage characteristic curve of the multi-peak resonant tunneling diode, the function stage including:

at least one first circuit branch having a resistor, a diode with an anode connected electrically to the resistor, and a voltage source with a positive terminal connected to a cathode of the diode;

at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch;

the first and third circuit branches representing positive resistance sections, and the second and third circuit branches representing negative resistance sections of the current-voltage characteristic curve;

(b) providing design data, which specifies each of the circuit devices and connections of the circuit devices in the circuit model, to a computer loaded with a circuit simulation program in a format acceptable to the circuit simulation program;

(c) running the computer to simulate operation of the electronic circuit; and (d) effecting a patterning of the electronic circuit on a semiconductor wafer to produce the semiconductor device after verifying, based on results of the simulation, that the electronic circuit will operate as intended;

wherein the current-voltage characteristic curve has starting and ending points and multiple breakpoints between the starting and ending points that are interconnected to form a series of linear segments which approximate the current-voltage characteristic curve, each of the first circuit branches being associated with a corresponding one of the breakpoints that is connected to adjacent upward linear segments, each of the second circuit branches being associated with a corresponding one of the breakpoints that is connected to adjacent downward linear segments.

2. The method of claim 1, wherein the circuit simulation program is SPICE.

3. The method of claim 1, wherein the function stage further includes an input voltage source representing sweeping DC voltage range of the current-voltage characteristic curve, and a dummy voltage source which interconnects the input voltage source to the first, second and third circuit branches and which serves to measure output current flowing through the multi-peak resonant tunneling diode.

4. The method of claim 3, wherein the circuit model further includes an input stage for implementing input resistance of the multi-peak resonant tunneling diode.

5. The method of claim 4, wherein the input stage has a 1 MΩ resistance.

6. The method of claim 3, wherein the circuit model further includes an output stage for implementing output resistance of the multi-peak resonant tunneling diode.

7. The method of claim 6, wherein the output stage includes an output resistor and a linear dependent current source connected across the output resistor for reflecting the output current through the dummy voltage source to the output stage.

8. The method of claim 7, wherein the output resistor has a 1 MΩ resistance.

9. The method of claim 1, wherein the resistor in each of the first and second circuit branches is equal to absolute value of the reciprocal of the difference in the slopes of the adjacent linear segments connected to the corresponding breakpoint, and the voltage source in each of the first and second circuit branches is equal to the breakpoint voltage.

10. A method for simulating operation of a user-specified design of a multi-peak resonant tunneling diode-based electronic circuit, comprising the steps of:

(a) providing a circuit model for the electronic circuit which includes a plurality of circuit devices, one of the circuit devices being a multi-peak resonant tunneling diode which is modeled by a parasitic resistance in series with a parallel combination of a voltage-controlled current source and an intrinsic capacitance, the voltage-controlled current source having an equivalent circuit model with a function stage for realizing a current-voltage characteristic curve of the multi-peak resonant tunneling diode, the function stage including:

at least one first circuit branch having a resistor, a diode with an anode connected electrically to the resistor, and a voltage source with a positive terminal connected to a cathode of the diode;

at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch;

the first and third circuit branches representing positive resistance sections, and the second and third circuit branches representing negative resistance sections of the current-voltage characteristic curve;

(b) providing design data, which specifies each of the circuit devices and connections of the circuit devices in the circuit model, to a computer loaded with a circuit simulation program in a format acceptable to the circuit simulation program; and (c) running the computer to simulate operation of the electronic circuit;

wherein the current-voltage characteristic curve has starting and ending points and multiple breakpoints between the starting and ending points that are interconnected to form a series of linear segments which approximate the current-voltage characteristic curve, each of the first circuit branches being associated with a corresponding one of the breakpoints that is connected to adjacent upward linear segments, each of the second circuit branches being associated with a corresponding one of the breakpoints that is connected to adjacent downward linear segments.

11. The method of claim 10, wherein the circuit simulation program is SPICE.

12. The method of claim 10, wherein the function stage further includes an input voltage source representing sweeping DC voltage range of the current-voltage characteristic curve, and a dummy voltage source which interconnects the input voltage source to the first, second and third circuit branches and which serves to measure output current flowing through the multi-peak resonant tunneling diode.

13. The method of claim 12, wherein the circuit model further includes an input stage for implementing input resistance of the multi-peak resonant tunneling diode.

14. The method of claim 13, wherein the input stage has a 1 MΩ resistance.

15. The method of claim 12, wherein the circuit model further includes an output stage for implementing output resistance of the multi-peak resonant tunneling diode.

16. The method of claim 15, wherein the output stage includes an output resistor and a linear dependent current source connected across the output resistor for reflecting the output current through the dummy voltage source to the output stage.

17. The method of claim 16, wherein the output resistor has a 1 MΩ resistance.

18. The method of claim 10, wherein the resistor in each of the first and second circuit branches is equal to absolute value of the reciprocal of the difference in the slopes of the adjacent linear segments connected to the corresponding breakpoint, and the voltage source in each of the first and second circuit branches is equal to the breakpoint voltage.

19. A large signal multi-peak resonant tunneling diode SPICE model comprising a parasitic resistance in series with a parallel combination of a voltage-controlled current source and an intrinsic capacitance, the voltage-controlled current source having an equivalent circuit model with a function stage for realizing a current-voltage characteristic curve of the multi-peak resonant tunneling diode, the function stage including:

at least one first circuit branch having a resistor, a diode with an anode connected electrically to the resistor, and a voltage source with a positive terminal connected to a cathode of the diode;

at least one second circuit branch connected in parallel to the first circuit branch and having a resistor, a diode with a cathode connected electrically to the resistor of the second circuit branch, and a voltage source with a positive terminal connected to an anode of the diode of the second circuit branch; and a third circuit branch connected in parallel to the first and second circuit branches and having a resistor and a voltage source with a positive terminal connected to the resistor of the third circuit branch;

the first and third circuit branches representing positive resistance sections, and the second and third circuit branches representing negative resistance sections of the current-voltage characteristic curve;

wherein the current-voltage characteristic curve has starting and ending points and multiple breakpoints between the starting and ending points that are interconnected to form a series of linear segments which approximate the current-voltage characteristic curve, each of the first circuit branches being associated with a corresponding one of the breakpoints that is connected to adjacent upward linear segments, each of the second circuit branches being associated with a corresponding one of the breakpoints that is connected to adjacent downward linear segments.

20. The large signal multi-peak resonant tunneling diode SPICE model of claim 19, wherein the function stage further includes an input voltage source representing sweeping DC voltage range of the current-voltage characteristic curve, and a dummy voltage source which interconnects the input voltage source to the first, second and third circuit branches and which serves to measure output current flowing through the multi-peak resonant tunneling diode.

21. The large signal multi-peak resonant tunneling diode SPICE model of claim 20, wherein the circuit model further includes an input stage for implementing input resistance of the multi-peak resonant tunneling diode.

22. The large signal multi-peak resonant tunneling diode SPICE model of claim 21, wherein the input stage has a 1 MΩ resistance.

23. The large signal multi-peak resonant tunneling diode SPICE model of claim 20, wherein the circuit model further includes an output stage for implementing output resistance of the multi-peak resonant tunneling diode.

24. The large signal multi-peak resonant tunneling diode SPICE model of claim 23, wherein the output stage includes an output resistor and a linear dependent current source connected across the output resistor for reflecting the output current through the dummy voltage source to the output stage.

25. The large signal multi-peak resonant tunneling diode SPICE model of claim 24, wherein the output resistor has a 1 MΩ resistance.

26. The large signal multi-peak resonant tunneling diode SPICE model of claim 19, wherein the resistor in each of the first and second circuit branches is equal to absolute value of the reciprocal of the difference in the slopes of the adjacent linear segments connected to the corresponding breakpoint, and the voltage source in each of the first and second circuit branches is equal to the breakpoint voltage.

* * * * *